United States Patent
Bonneau et al.

[11] Patent Number: 6,111,471
[45] Date of Patent: Aug. 29, 2000

[54] APPARATUS AND METHOD FOR SETTING VCO FREE-RUNNING FREQUENCY

[75] Inventors: Dominique Bonneau, La Rochette; Vincent Vallet, Mennecy; Patrick Mone, Valbonne, all of France

[73] Assignee: International Business Machines Corporation, Armonk, N.Y.

[21] Appl. No.: 09/304,608

[22] Filed: May 4, 1999

[30] Foreign Application Priority Data

May 28, 1998 [EP] European Pat. Off. .............. 98480037

[51] Int. Cl.[7] ..................................................... H03L 7/00
[52] U.S. Cl. .............................. 331/25; 331/1 A; 331/11; 331/16; 331/179
[58] Field of Search .................................... 331/1 A, 1 R, 331/10–12, 16, 18, 25, 179; 327/156–159

[56] References Cited

U.S. PATENT DOCUMENTS

| | | | |
|---|---|---|---|
| 5,182,528 | 1/1993 | Zuta | 331/1 A |
| 5,592,129 | 1/1997 | Fried et al. | 331/111 |
| 5,610,560 | 3/1997 | Sauer et al. | 331/8 |
| 5,777,520 | 7/1998 | Kawakami | 331/1 R |

*Primary Examiner*—David Mis
*Attorney, Agent, or Firm*—Joseph P. Abate

[57] ABSTRACT

The present invention provides an apparatus for setting the free-running frequency of a VCO to a reference frequency. The apparatus comprises frequency range means for setting the VCO within a VCO frequency range among a plurality of VCO frequency ranges. First counting means are operable to count to a first value at the VCO frequency rate and to provide a first ending signal when the first value is reached. Second counting means are operable to count to a second value at the reference frequency rate and to provide a second ending signal when the second value is reached. The second counting means are also operable to provide a reference count value when the first value is reached by the first counting means. A state machine is responsive to the first and second counting means for selecting a VCO frequency range among the plurality of VCO frequency ranges such that the VCO free-running frequency obtained through the selected range gives the closest value to the reference frequency. The state machine comprises means for decrementing the reference count value provided by the second counting means and also means for comparing the decrementation duration to the counting duration of the second counting means. The selection of the best VCO frequency range is based on this comparison.

15 Claims, 3 Drawing Sheets

APPARATUS AND METHOD FOR SETTING VCO FREE-RUNNING FREQUENCY

TECHNICAL FIELD

The present invention relates to a method and apparatus for setting the free-running frequency of a voltage controlled oscillator (VCO), and more particularly to such method and apparatus without requiring laser trimming technique or analogic components.

BACKGROUND ART

Currently all PLLS, except the all-digitally-implemented PLLS, utilise a VCO to provide the clocking means. A VCO is employed for example, for this purpose in the design of a magnetic recording channel.

A major problem in the design of PLLs is ensuring a very tight tolerance for the free-running frequency of the VCO. To achieve this, temperature compensation techniques are often incorporated into the design of the VCO circuitry. However, since the variations in process parameters (such as oxide thickness, threshold voltage, etc.) are statistically independent of each other; the effect on the circuit cannot be fully overcome using design techniques. The VCO free-running frequency tolerance be very tight and not vary more than 1%–2%.

Heretofore, the chip-to-chip variation in VCO free-running frequency was resolved by physically modifying the PLL chip by (1) using a laser trim technique involving trimming resistors or capacitors which are on the module substrate and connected to the VCO circuit inside the chip; or (2) a high current zapping technique to blow out resistors on the chip at the wafer level; or (3) using digital-to-analog (D/A) converters to convert the variations into bias voltage to be applied to the VCO.

The general state of the prior art with respect to solving the problem of process tolerance is illustrated with reference to the following patent:

U.S. Pat. No. 4,929,918 describes a circuit for setting the free-running frequency of a VCO which forms part of a PLL, using D/A converters (DAC). At system power on, the PLL is automatically disabled and a DAC in the PLL is set to a value corresponding substantially to the center of a pre selected lock range. A frequency-locked loop (FLL), interconnected to the PLL and which includes a second DAC operates to generate a bias voltage for incrementing or decrementing the VCO output frequency until the VCO pulse count stored in a register equals an expected count, whereupon the VCO will be set at its free-running frequency.

All the previous cited techniques are expensive and time consuming. The high current zapping technique is unreliable for the tight tolerances required for a VCO.

The DAC components are not suitable for low gain VCO, and particularly not suitable for high operating frequencies (over 100 Mhz). Moreover, the DAC components are hardware expensive.

None of the cited techniques and references teach a system for setting the free-running frequency of a VCO which is fully digital. Moreover, none of these references suggest a system which operates on a high operating frequency (above 100 MHz) and which is particularly suitable for low gain VCO.

Accordingly, it would be desirable to provide an apparatus and associated method which eliminates the aforementioned problems.

SUMMARY OF THE INVENTION

It is an object of this invention to provide an apparatus for achieving an automatic setting frequency circuit for use in connection with a VCO.

This object is achieved by employing a circuit discussed in detail hereinafter.

The present invention provides an apparatus for setting the free-running frequency of a VCO to a reference frequency. The apparatus comprises frequency range means for setting the VCO within a VCO frequency range among a plurality of VCO frequency ranges. First counting means are operable to count to a first value at the VCO frequency rate and to provide a first ending signal when the first value is reached. Second counting means are operable to count to a second value at the reference frequency rate and to provide a second ending signal when the second value is reached. The second counting means are also operable to provide a reference count value when the first value is reached by the first counting means. A state machine is responsive to the first and second counting means for selecting a VCO frequency range among the plurality of VCO frequency ranges such that the VCO free-running frequency obtained through the selected range gives the closest value to the reference frequency.

In a preferred embodiment, the state machine comprises means for decrementing the reference count value provided by the second counting means and also means for comparing the decrementation duration to the counting duration of the second counting means. The selection of the best VCO frequency range is based on this comparison.

Preferably the method for setting the free-running frequency of a VCO to a reference frequency, comprises the steps of:
a. applying to the VCO a first frequency range among a plurality of VCO frequency ranges;
b. supplying the VCO output pulses to a VCO counter operable to count to a first value;
c. supplying pulses from a reference clock to a reference counter operable to successively count to a second value until the first value is reached by the VCO counter;
d. storing the value reached by the reference counter when said first value is reached;
e. applying to the VCO a second frequency range;
f. resetting both counters and repeating steps b) to e) until the VCO counter counts faster than the reference counter;
g. decrementing the last value stored from the reference counter while the reference counter counts to the second value;
h. comparing the decrementation duration to the reference counter's duration;
i. selecting the current frequency range or the previous frequency range according to the comparing step result to set the VCO to its free-running frequency.

DETAILED DESCRIPTION OF THE INVENTION

Figure 1:
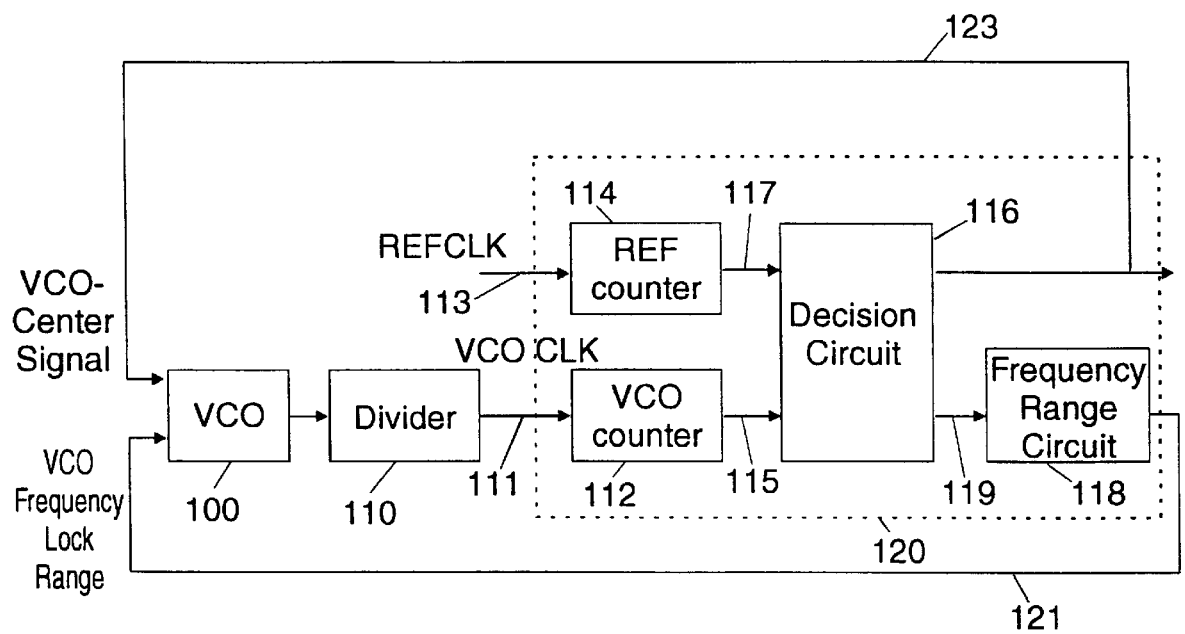
FIG. 1 shows a block diagram of the circuits of the present invention.

Referring now to the drawings, and more particularly to FIG. 1, a block diagram of a circuit embodying the invention is described. The circuit comprises a Voltage Control Oscillator (VCO) 100, a divider circuit 110, and an automatic setting circuit 120. The setting circuit 120 is composed of a VCO counter 112 and a Reference counter 114, both connected to a decision circuit 116. The output of the Decision circuit 116 is input to a Frequency Range circuit 118 which loops back to the VCO 100. The decision circuit also outputs a VCO-Center signal on line 123.

The circuit of the arrangement operates as follows: at the initialisation, the VCO is set to a center frequency through the VCO-center signal. In case the VCO is part of a Phase Locked Loop (PLL), the PLL is disabled during this initial step.

The Frequency Range circuit is set to an initial frequency lock range. In a preferred embodiment the Frequency Range circuit is a two-bits counter which allows four operating frequency lock ranges. It should be understood that increasing the number of bits of the counter will encompass a larger operating frequency lock ranges, thereby increasing the accuracy of the VCO setting.

Preferably, the initial value is chosen to be the lowest frequency lock range corresponding to a low speed VCO.

In a preferred embodiment the output of the VCO is input to the divider circuit 110 to deliver a divided VCO clock on line 111 in order to provide to the VCO counter a clock running on a frequency which is in the same range as the reference frequency. Similarly, the reference frequency could be divided to allow the Automatic Setting circuit 120 to operate on any frequency.

The VCO clock on line 111 enters the VCO counter 112 to output a VCO count flag on line 115 to indicate that the VCO counter has reached a VCO predetermined value.

The REF clock which is provided in a usual manner (by means of a quartz for example) on line 113 enters the REF counter 114 which delivers on line 117 a REF flag to indicate that the REF counter has reached a REF predetermined value. Moreover, the REF counter also delivers on line 117 a reference count value when the VCO counter has reached its predetermined VCO value before the REF counter has reached its predetermined REF value.

Preferably the VCO predetermined value and the REF predetermined are chosen to be the same, but the invention could operate with different values.

The REF counter also delivers the value it has reached in case the VCO counter has reached first the VCO predetermined value. The occurrence of both flags is compared within the Decision circuit 116. Upon the result of the comparison, the VCO is locked on the current frequency range through line 123 otherwise another frequency range is applied to the VCO through line 121 by setting the Frequency Range circuit 118 to the next or to the previous value.

In case the REF counter reaches first the REF predetermined value which means than the VCO frequency is slower than the REF frequency, a faster VCO frequency range is applied to the VCO by incrementing the value of the Frequency Range circuit. A new flag comparison is then performed as previously explained. The VCO frequency range is incremented as long as the VCO frequency is slower than the REF frequency. When the VCO frequency becomes higher than the REF frequency, then the Decision circuit either selects the current frequency lock range or the previous one according which one gives the VCO frequency which is closest to the reference frequency.

The decision process is performed within the Decision circuit 116 using a state machine which is now explained with reference to FIGS. 2 and 3.

Figure 2:
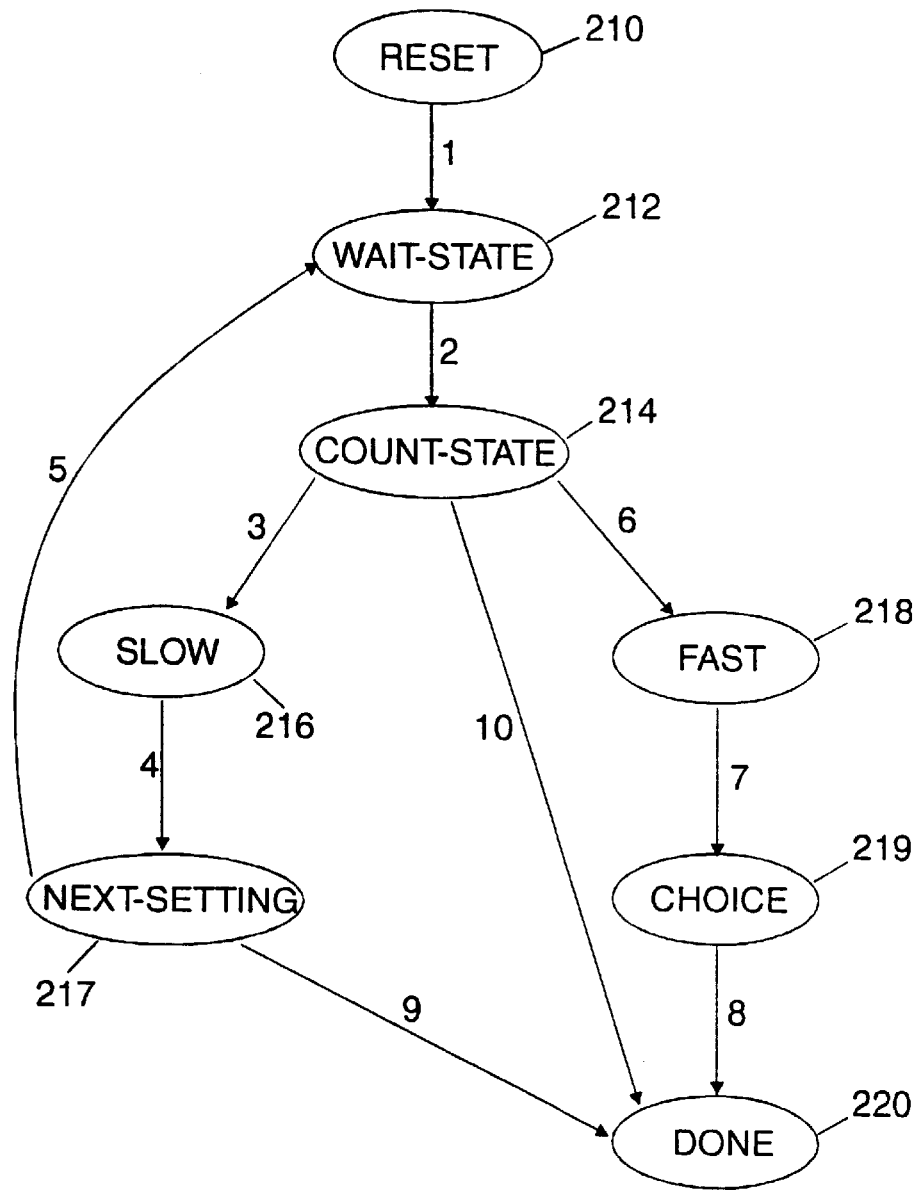
FIG. 2 is a state diagram of the state machine of the present invention.
Figure 3:
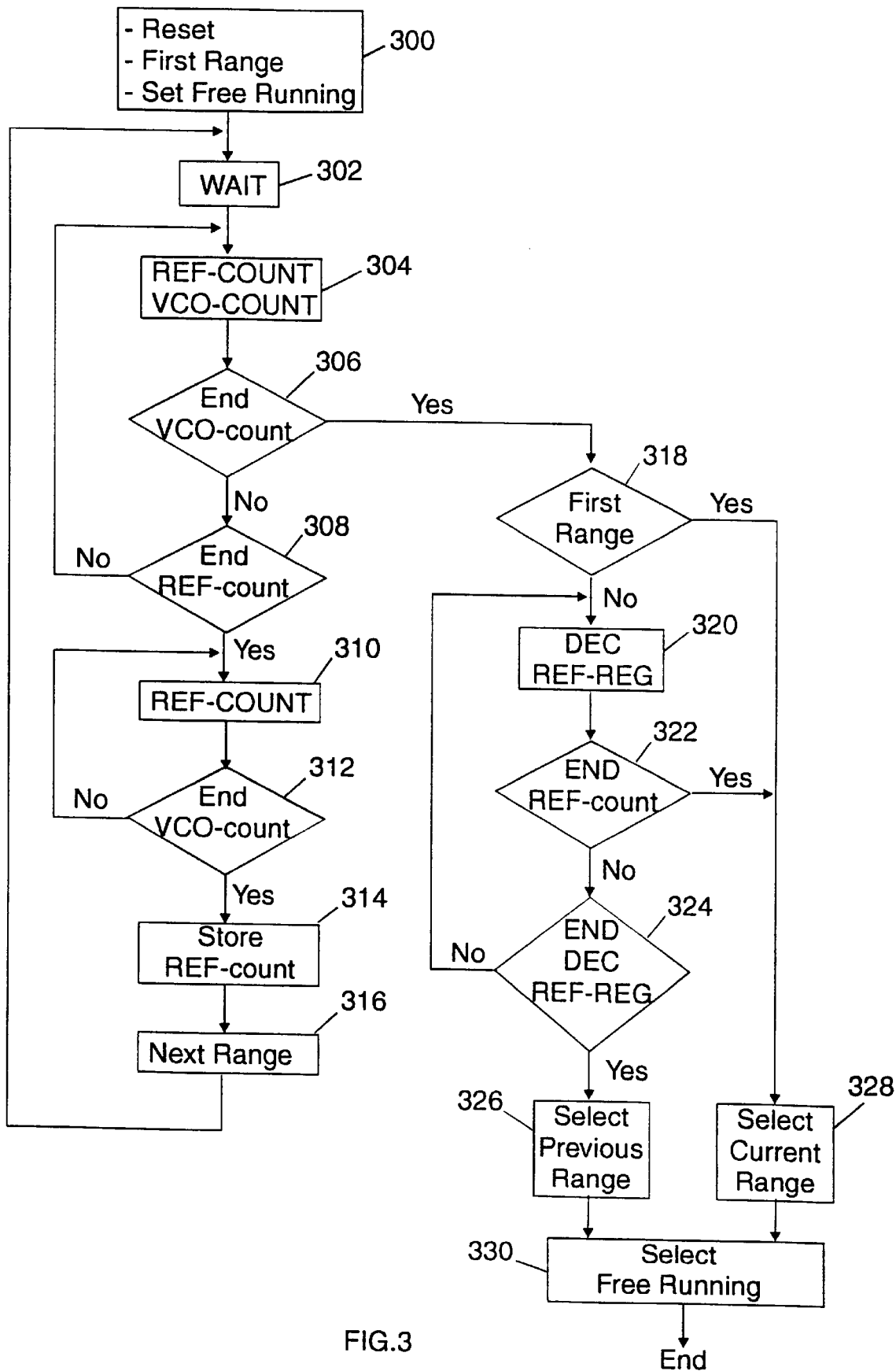
FIG. 3 is a flowchart illustrating the method of the present invention.

FIG. 2 shows an example of a state diagram to perform the decision operation.

On an initial state (210) all the counters are reset (at each power-on for example), the free-running frequency mode of the VCO is asserted, and an initial frequency lock range is selected. Thereafter the state machine enters a second state (212) wherein the VCO is set to the first selected frequency lock range. The second state times a fixed delay which in a preferred embodiment is equal to the duration of a REF clock cycle.

From the second state, the state machine enters a counting state (214) wherein the REF counter and the VCO counter are both started. Thereafter the state machine enters one of the following states (216), (218) or (220).

State (216) describes the case where the REF counter reaches first the predetermined value meaning that the VCO frequency is slower than the REF frequency. During this latter state, the REF counter is restart while the VCO counter follows its current counting.

The state machine enters the following state (217) as soon as one of the REF counter or the VCO counter reaches first the predetermined value. During state (217), the value reached by the REF counter is stored in a decrementing register, and a second frequency lock range is selected.

Next, the state machine loops back to the second state (212) wherein the VCO is set to the second frequency lock range. And the state machine cycles through states (214), (216) and (217) as long as the VCO frequency is slower than the REF frequency.

In case the VCO frequency is still slower than the REF frequency after the last frequency lock range has been selected, the state machine enters an end state (220) and the VCO is set to the last current frequency lock range which therefore gives in this case the VCO free-running frequency which is closest to the reference frequency. Those skilled in the art will appreciate that with the system of the invention, the VCO circuit always converges to a VCO free-running frequency as a final choice of a frequency lock range is always forced.

State (218) describes the case where the VCO counter reaches the predetermined value before the REF counter meaning that the VCO frequency is faster than the REF frequency. It has to be noted that this state (218) may only occur when the VCO has been set to at least a second frequency lock range as previously explained. During this state, the last REF counter value which has been stored in the decrementing register is decremented at the REF clock rate, while the REF counter still counts.

The state machine enters the next state (219) as soon as either the REF counter has reached first the predetermined value or the decrementing register has reached first the initial starting value. Preferably the initial value is chosen to be equal to zero. In the case the REF counter has reached the predetermined value first, the current frequency lock range is retained as giving the best VCO setting.

In the other case where the initial starting value is reached first, the VCO is set to the previous frequency lock range for which the VCO free-running frequency is closest to the REF frequency than for the current frequency lock range.

Finally the state machine goes to the end state (220).

In the case the VCO frequency is faster than the REF frequency from the first selected frequency lock range, the state machine enters directly the end state (220) and this first range is regarded as giving the closest VCO free-running frequency.

In an alternate embodiment, the state machine may enter a further state for the case when the VCO frequency is slower than a predetermined value from the first selected frequency lock range. This case is interpreted as having a VCO device which is out of specifications and the state machine goes directly to the end state (220). This threshold value may be chosen to be equal to half the frequency of the REF frequency, but it is understood that any other threshold value may be selected. This alternative allows to perform diagnostic tests to sort circuits.

One exemplary algorithm for the state machine is now described with reference to FIG. 3.

On a first step (300) the REF counter and the VCO counter are reset (to the zero value), the decrementing register is reset, the VCO free-running mode is asserted and the Frequency Range circuit selects a first frequency lock range.

In step (302) a delay is maintained to ensure that the VCO reaches a steady state.

Next on step (304) the REF counter and the VCO counter are started.

A first test is performed on step (306) to verify whether the VCO counting is ended or not. In case the VCO counting is ended (branch YES), the process jumps to step (318) which is further explained. In case the VCO counting is not ended (branch NO), a second test is performed on step (308) to verify whether the REF counting is ended or not.

If it is not ended (branch NO), then the process loops back to step (304) otherwise (branch YES) the process follows with step (310).

On step (310) the Ref counter is restart from the zero value and a new test is performed on step (312) to verify whether the VCO counting is ended or not.

If it is still not ended (branch NO), the process loops back to step (310). If it is ended (branch YES) then the value reached by the REF counter simultaneously to the VCO count ending is stored in the decrementing register on step (314).

On step (316) the Frequency Range circuit is set to the next frequency lock range, and the process loops back to step (302).

Going back to step (318) which follows the end of the VCO counting of step (306), a new test is performed to verify whether the process operates on the first frequency range or on a further one.

In case it is the first frequency range (branch YES), then the process goes to step (328) wherein the current frequency range is chosen as the final value.

In case the process operates on a further frequency range (branch NO), next step (320) is performed wherein a decrementation operation is started from the value stored in the decrementing register (at step 314).

On next step (322) a test is performed to verify whether the REF counting is ended or not. If it is ended (branch YES), the process goes to step (328) and next to step (330) wherein the VCO free-running mode is deasserted.

If the REF counting is not ended (branch NO), a next test is performed on step (324) to verify whether the decrementing operation is ended or not. If not, the process loops back to step (320) otherwise a selection step (326) is performed wherein the Frequency Range circuit is set to the previous frequency range to be chosen as the final selected value. Finally the process ends with step (330).

While the invention has been particularly shown and described with reference to a preferred embodiment thereof, it will be understood by those skilled in the art that various change in form and details may be made without departing from the spirit and scope of the invention. Particularly it is an advantageous feature of the invention that the circuit is preferably described with the so-called VHDL (very High Design Level) language and thus is technology independent. As such any various hardware implementation of the circuits of the invention may be used.

What is claimed is:

1. Apparatus for setting the free-running frequency of a VCO to a reference frequency, comprising:

frequency range means for setting the VCO within a VCO frequency range among a plurality of VCO frequency ranges;

first counting means operable to count to a first value at the VCO frequency rate and for providing a first ending signal when said first value is reached;

second counting means operable to count to a second value at the reference frequency rate and for providing a second ending signal when said second value is reached or for providing a reference count value when said first value is reached by said first counting means;

a state machine responsive to said first and second counting means for selecting a VCO frequency range among the plurality of VCO frequency ranges, said selected VCO frequency range being such that the VCO free-running frequency is the closest to the reference frequency.

2. The apparatus of claim 1 wherein the state machine comprises means for decrementing said reference count value; and means for comparing the decrementation duration to the counting duration of said second counting means.

3. The apparatus of claim 1 wherein the state machine comprises a digital comparator for comparing said reference count value to the value of said second counting means when said first counting means has reached the first value.

4. The apparatus according to claim 1, wherein said first value and said second value are equal.

5. The apparatus according to claim 1, wherein said frequency range means comprising a digital counter.

6. Apparatus for setting the free-running frequency of a VCO to a reference frequency, comprising:

frequency range means for setting the VCO within a VCO frequency range among a plurality of VCO frequency ranges;

first counting means operable to count to a first value at the VCO frequency rate and for providing a first ending signal when said first value is reached;

second counting means operable to count to a second value at the reference frequency rate and for providing a second ending signal when said second value is reached or for providing a reference count value when said first value is reached by said first counting means;

a state machine responsive to said first and second counting means for selecting a VCO frequency range among the plurality of VCO frequency ranges, said selected VCO frequency range being such that the VCO free-running frequency is the closest to the reference frequency, said apparatus further comprising means for storing said reference count value.

7. The apparatus of claim 6 wherein the state machine comprises means for decrementing said reference count value; and means for comparing the decrementation duration to the counting duration of said second counting means.

8. The apparatus of claim 6 wherein the state machine comprises a digital comparator for comparing said reference count value to the value of said second counting means when said first counting means has reached the first value.

9. Apparatus for setting the free-running frequency of a VCO to a reference frequency, comprising:

frequency range means for setting the VCO within a VCO frequency range among a plurality of VCO frequency ranges;

first counting means operable to count to a first value at the VCO frequency rate and for providing a first ending signal when said first value is reached;

second counting means operable to count to a second value at the reference frequency rate and for providing a second ending signal when said second value is reached or for providing a reference count value when said first value is reached by said first counting means;

a state machine responsive to salad first and second counting means for selecting a VCO frequency range among the plurality of VCO frequency ranges, said selected VCO frequency range being such that the VCO free-running frequency is the closest to the reference frequency, said apparatus further comprising a divider for dividing the free-running frequency of the VCO by a pre selected factor, said divider having an input coupled to the output of said VCO for receiving said VCO free-running frequency and an output coupled to the input of said VCO counter for providing the divided VCO free-running frequency.

10. A method for setting the free-running frequency of a VCO to a reference frequency, comprising the steps of:

a. applying to the VCO a first frequency range among a plurality of VCO frequency ranges;

b. supplying the VCO output pulses to a VCO counter operable to count to a first value;

c. supplying pulses from a reference clock to a reference counter operable to successively count to a second value until the first value is reached by the VCO counter;

d. storing the value reached by the reference counter when said first value is reached;

e. applying to the VCO a second frequency range;

f. resetting both counters and repeating steps b) to e) until the VCO counter counts faster than the reference counter;

g. decrementing the last value stored from the reference counter while the reference counter counts to the second value;

h. comparing the decrementation duration to the reference counter's duration;

i. selecting the current frequency range or the previous frequency range according to the comparing step result to set the VCO to its free-running frequency.

11. The method according to claim 10 further comprising after step e):

applying a steady state until the free running frequency is stabilised.

12. The method according to claim 10 wherein the first value and the second value are equal.

13. A method for setting the free-running frequency of a VCO to a reference frequency, comprising the steps of:

a. applying to the VCO a first frequency range among a plurality of VCO frequency ranges;

b. supplying the VCO output pulses to a VCO counter operable to count to a first value;

c. supplying pulses from a reference clock to a reference counter operable to successively count to a second value until the first value is reached by the VCO counter;

d. storing the value reached by the reference counter when said first value is reached;

e. applying to the VCO a second frequency range;

f. resetting both counters and repeating steps b) to e) until the VCO counter counts faster than the reference counter;

g. decrementing the last value stored from the reference counter while the reference counter counts to the second value;

h. comparing the decrementation duration to the reference counter's duration;

i. selecting the current frequency range or the previous frequency range according to the comparing step result to set the VCO to its free-running frequency; wherein the steps d) to i) are performed by a state machine.

14. The method according to claim 13 further comprising further comprising after step e):

applying a steady state until the free running frequency is stabilised.

15. The method according to claim 13 wherein the first value and the second value are equal.

* * * * *